United States Patent
Martin et al.

(12)

(10) Patent No.: US 6,507,225 B2
(45) Date of Patent: Jan. 14, 2003

(54) CURRENT MODE DRIVER WITH VARIABLE EQUALIZATION

(75) Inventors: Aaron K. Martin, Hillsboro, OR (US); Stephen R. Mooney, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/835,600

(22) Filed: Apr. 16, 2001

(65) Prior Publication Data

US 2002/0149402 A1 Oct. 17, 2002

(51) Int. Cl.[7] ............................................... H03K 3/00
(52) U.S. Cl. ...................................... 327/108; 327/404
(58) Field of Search ..................... 327/108–112, 404; 326/30, 82–86; 375/219, 227

(56) References Cited

U.S. PATENT DOCUMENTS

| | | | | | |
|---|---|---|---|---|---|
| 4,573,168 | A | * | 2/1986 | Henze et al. | 327/326 |
| 4,624,006 | A | * | 11/1986 | Rempfer et al. | 327/404 |
| 5,216,667 | A | * | 6/1993 | Chu et al. | 370/24 |
| 5,253,249 | A | * | 10/1993 | Fitzgerald et al. | 370/24 |
| 5,457,406 | A | * | 10/1995 | Takada et al. | 327/315 |
| 5,490,171 | A | * | 2/1996 | Epley et al. | 327/208 |
| 5,541,535 | A | * | 7/1996 | Cao et al. | 326/83 |
| 5,578,939 | A | * | 11/1996 | Beers et al. | 326/30 |
| 5,579,336 | A | * | 11/1996 | Fitzgerald et al. | 375/219 |
| 5,604,450 | A | | 2/1997 | Borkar et al. | 326/82 |
| 6,087,847 | A | | 7/2000 | Mooney et al. | 326/30 |
| 6,150,806 | A | | 11/2000 | Canard et al. | 323/315 |

OTHER PUBLICATIONS

Comer, D.T., et al., "A CMOS Voltage to Current Converter For Low Voltage Applications", *This information is directly from Donald T. Comer's web site*. http://www.ee.byu.edu/faculty/comerdt/publications.html, 13 p., (Feb. 11, 1997).

Farjad–Rad, R., et al., "A 0.4–um CMOS 10–Gb/s 4–PAM Pre–Emphasis Serial Link Transmitter", *IEEE Journal of Solid–State Circuits, 34* (5), pp. 580–585, (May 1999).

Filanovsky, I.M., "Voltage Reference Using Mutual Compensation of Mobility and Threshold Voltage Temperature Effects", *ISCAS 2000– IEEE International Symposium on Circuits and Systems*, pp. V197–V200, (May 2000).

Haycock, M., et al., "A 2.5Gb/s Bidirectional Signaling Technology", *Hot Interconnects Symposium V*, pp. 1–8, (Aug. 1997).

Lee, S., et al., "A Temperature and Supply–Voltage Insensitive CMOS Current Reference", *IEICE Trans. Electron, vol. E82–C*, pp. 1562–1566, (Aug. 1999).

* cited by examiner

*Primary Examiner*—Kenneth B. Wells
(74) *Attorney, Agent, or Firm*—Schwegman, Lundberg, Woessner & Kluth P.A.

(57) ABSTRACT

A simultaneous bidirectional data port circuit includes a current mode output driver for driving an output node and a current mode return driver for driving a differential receiver. The current mode return driver is scalable to reduce current requirements. Each driver is divided into driver segments. Some driver segments are driven by outbound data, and other driver segments are driven by pre-equalization data. Variable pre-equalization is provided by a pre-driver that selects the number of driver segments to be driven with pre-equalization data and the number of driver segments to be driven by outbound data.

27 Claims, 5 Drawing Sheets

CURRENT MODE DRIVER WITH VARIABLE EQUALIZATION

FIELD

The present invention relates generally to integrated circuit interfaces, and more specifically to integrated circuit interfaces having current mode drivers.

BACKGROUND

Integrated circuits typically have dedicated interface circuits to communicate with other integrated circuits and other systems. Signals that travel from one integrated circuit to another are becoming faster and faster. As signal speeds increase, the effect of imperfect "channels" also increases. A "channel," for the purposes of this description, is any medium that the signal passes through. For example, a channel may consist of printed circuit board traces or wires routed between integrated circuits. One possible effect of an imperfect channel is frequency dependent attenuation of signal amplitudes. In general, when the signal amplitude is attenuated as a function of frequency, the signal becomes smaller as the speed increases. When the signal gets too small, communications between integrated circuits can become unreliable.

One known method for compensating for frequency dependent attenuation is the use of pre-equalization at the driver. Pre-equalization adjusts the amplitude of the driver depending on the frequency of outbound data. Successful pre-equalization compensates for signal loss in the channel, and results in a substantially constant amplitude received voltage wave for low and high frequency data. One mechanism for pre-equalization is described in: Ramin Farjad-Rad, Chih-Kong Ken Yang, Mark A. Horowitz, and Thomas H. Lee, "A 0.4-um CMOS 10-Gb/s 4-PAM Pre-Emphasis Serial Link Transmitter," Vol. 34, No. 5, IEEE Journal of Solid-State Circuits, (May 1999).

In addition to problems associated with increased signal speed, modem integrated circuits suffer from too many external interconnects. As more circuitry is placed in integrated circuits, the need for additional "pins" on the integrated circuits has increased dramatically.

For the reasons stated above, and for other reasons stated below which will become apparent to those skilled in the art upon reading and understanding the present specification, there is a need in the art for alternate integrated circuit interfaces.

DESCRIPTION OF EMBODIMENTS

In the following detailed description of the embodiments, reference is made to the accompanying drawings which show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the fall scope of equivalents to which such claims are entitled.

The method and apparatus of the present invention provide a simultaneous bidirectional data port circuit that includes a current mode output driver for driving an output node and a current mode return driver for driving a differential receiver. The current mode return driver is scalable to reduce current requirements. Each driver is divided into driver segments. Some driver segments are driven by outbound data, and other driver segments are driven by pre-equalization data. Variable pre-equalization is provided by a pre-driver that selects the number of driver segments to be driven with pre-equalization data and the number of driver segments to be driven by outbound data.

Figure 1:
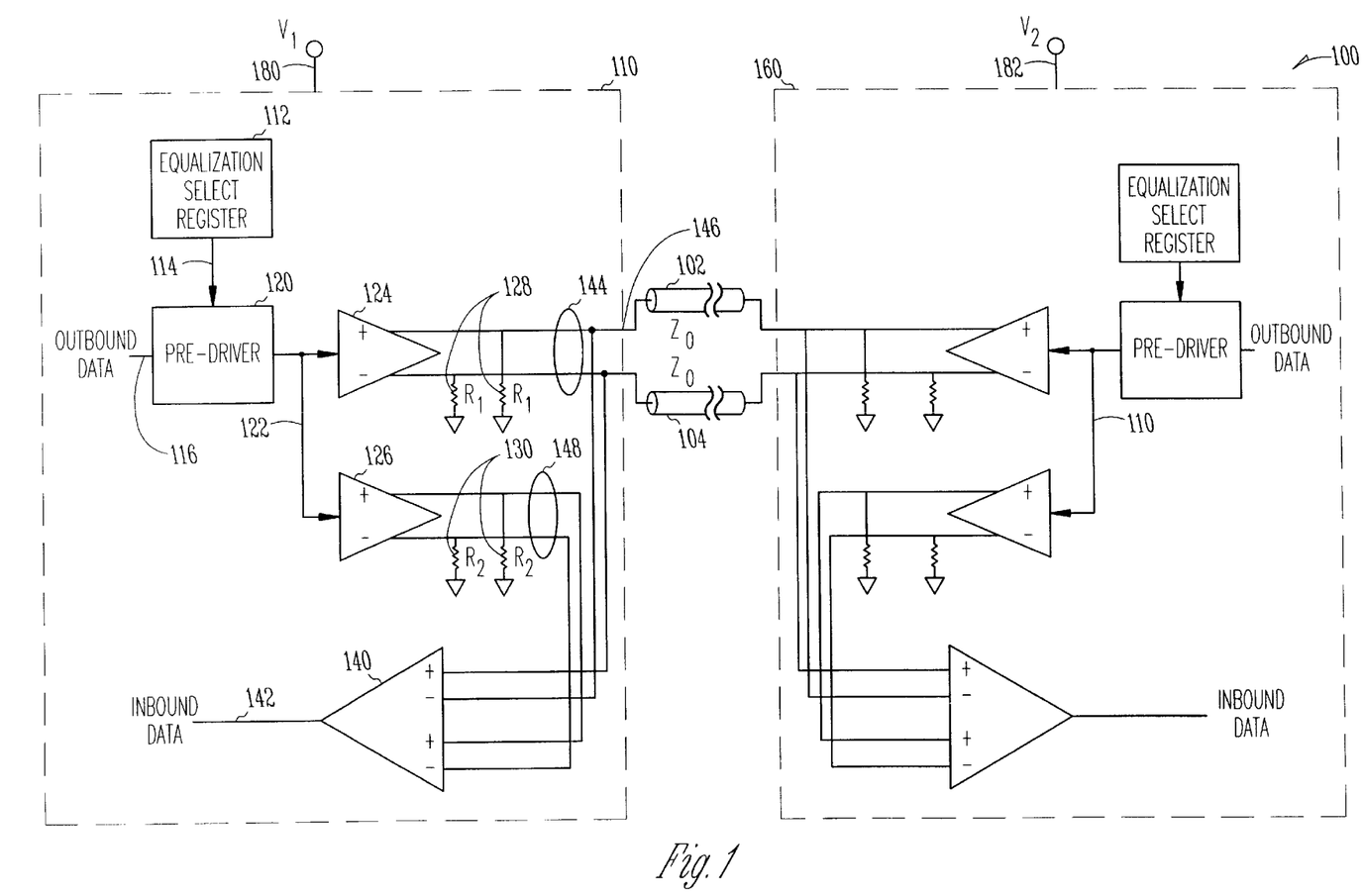
FIG. 1 shows an electronic system having two integrated circuits with simultaneous bidirectional port circuits.

FIG. 1 shows an electronic system having two integrated circuits with simultaneous bidirectional port circuits. System 100 includes integrated circuits 110 and 160 interconnected by conductors 102 and 104. In the embodiments represented by FIG. 1, conductors 102 and 104 are transmission lines having a characteristic impedance of $Z_0$. Integrated circuits 110 and 160 communicate bidirectionally and simultaneously, each using both conductors 102 and 104. Simultaneous bidirectional port circuits are shown within both integrated circuits 110 and 160. For simplicity, only one simultaneous bidirectional port circuit is shown in each of integrated circuits 110 and 160. In some embodiments, multiple simultaneous bidirectional ports exist, and a bus is formed from multiple pairs of conductors between integrated circuits 110 and 160. The simultaneous bidirectional port circuit within integrated circuit 110, and the operation thereof, are explained below. This explanation also applies to the simultaneous bidirectional port circuit within integrated circuit 160.

Integrated circuit 110 includes equalization select register 112, pre-driver 120, current mode output driver 124, current mode return driver 126, differential receiver 140, and termination resistors 128 and 130. Outbound data on node 116 is data generated within integrated circuit 110 that is to be transmitted through conductors 102 and 104 to be received by integrated circuit 160. Pre-driver 120 accepts the outbound data and drives current mode output driver 124, which in turn drives differential data lines 144. Differential data lines 144 exit integrated circuit 110 at differential data nodes 146, and drive conductors 102 and 104. Differential data lines 144 also feedback into integrated circuit 110, and drive a differential input node of differential receiver 140. Current mode return driver 126 drives differential data lines 148. Differential data lines 148 do not drive nodes off integrated circuit 110, but do feedback into integrated circuit 110 to drive a second differential input node of differential receiver 140.

Data on node 122 can drive current mode output driver 124 and current mode return driver 126 to one of multiple logical states. Drivers 124 and 126 are current drivers rather than voltage drivers. Current mode output driver 124 switches current between differential data lines 144 as a function of the logical state of data on node 122. Likewise, current mode return driver 126 switches current between differential data lines 148 as a function of the logical state of data on node 122.

As previously described, differential receiver 140 has two sets of differential input nodes, one coupled to differential data lines 144, and the other coupled to differential data lines 148. Differential data lines 144 include data driven by both integrated circuits 110 and 160. In contrast, data lines 148 only include data driven by integrated circuit 110. Differential receiver 140 subtracts the differential voltage on differential data lines 148 from a differential voltage on differential data lines 144 to produce inbound data on node 142. Inbound data on node 142 represents the outbound data sent from integrated circuit 160 to integrated circuit 110 across the simultaneous bidirectional interface.

In some embodiments, pre-driver 120 produces pre-equalization data from the outbound data and provides drivers 124 and 126 with both outbound data and pre-equalization data. In these embodiments, node 122 includes multiple physical nodes. For example, in some embodiments, pre-driver 120 drives a replica of the outbound data as well as pre-equalization data on multiple physical nodes to drivers 124 and 126. Pre-equalization data is utilized within driver 124 to adjust the amplitude of the output current drive on bidirectional data lines 144 to compensate for channel variations in conductors 102 and 104. For example, if high frequency signals are attenuated in conductors 102 and 104, current mode output driver 124 can utilize pre-equalization data to drive a higher amplitude when outbound data changes at a higher frequency. The operation of pre-driver 120 and driver 124 with respect to equalization is described in more detail with reference to the figures that follow.

In some embodiments, pre-driver 120 can perform variable equalization. In these embodiments, equalization select register 112 drives a select data value on node 114 to set the amount of equalization provided by pre-driver 120. Equalization select register 112 can be loaded in many different ways. For example, in some embodiments, equalization select register 112 is a memory mapped register. In other embodiments, equalization select register 112 is part of a scan chain, and is loaded with data during a scan sequence. In still other embodiments, equalization select register 112 does not exist within integrated circuit 110, and data node 114 is coupled to one or more physical contacts external to integrated circuit 110.

As previously described, drivers 124 and 126 are current mode drivers that switch currents between output nodes as a function of the logical state of the input node. Current mode output driver 124 drives a differential current on differential data lines 144. This differential current is terminated by the characteristic impedance ($Z_0$) of conductors 102 and 104, and the resistance ($R_1$) of resistors 128. Therefore, current mode output driver 124 is terminated with an impedance equal to the parallel combination of $Z_0$ and $R_1$. In contrast, current mode return driver 126 drives differential data lines 148 which are terminated only by resistors 130 having a resistance value of $R_2$.

In some embodiments, the resistance values of resistors 128 and 130 are modified in combination with the current drive of driver 126 to provide voltage scaling at the input to differential receiver 140. For example, in some embodiments, $R_2$ is a higher resistance value than the parallel combination of $R_1$ and $Z_0$, thereby allowing less current drive to be provided by current mode return driver 126 while maintaining the proper voltage level for comparison at differential receiver 140. Embodiments with differing current drives between drivers 124 and 126, and with different resistance values to provide voltage scaling, are described with reference to the following figures.

In some embodiments, drivers 124 and 126 have an output current that is largely independent of power supply voltage. For example, integrated circuit 110 is shown with a power supply voltage value $V_1$ on power supply input node 180. As power supply voltage value $V_1$ varies within a range, the output current drive of driver 124 remains substantially constant, and therefore the output voltage swing of driver 124 remains substantially constant. Likewise, as the power supply voltage value $V_2$ on node 182 varies, the output current driven by integrated circuit 160 is also substantially constant. In some embodiments, integrated circuits 110 and 160 have different power supply voltage values, but reliably communicate using the method and apparatus of the present invention because output currents on the simultaneous bidirectional output ports are substantially independent of power supply voltage.

Integrated circuits 110 and 160 can be any type of integrated circuits capable of including simultaneous bidirectional port circuits. For example, either integrated circuit can be a processor such as a microprocessor, a digital signal processor, a microcontroller, or the like. Integrated circuits 110 and 160 can also be integrated circuits other than a processor such as an application-specific integrated circuit (ASIC), a communications device, a memory controller, or a memory such as a dynamic random access memory (DRAM).

Figure 2:
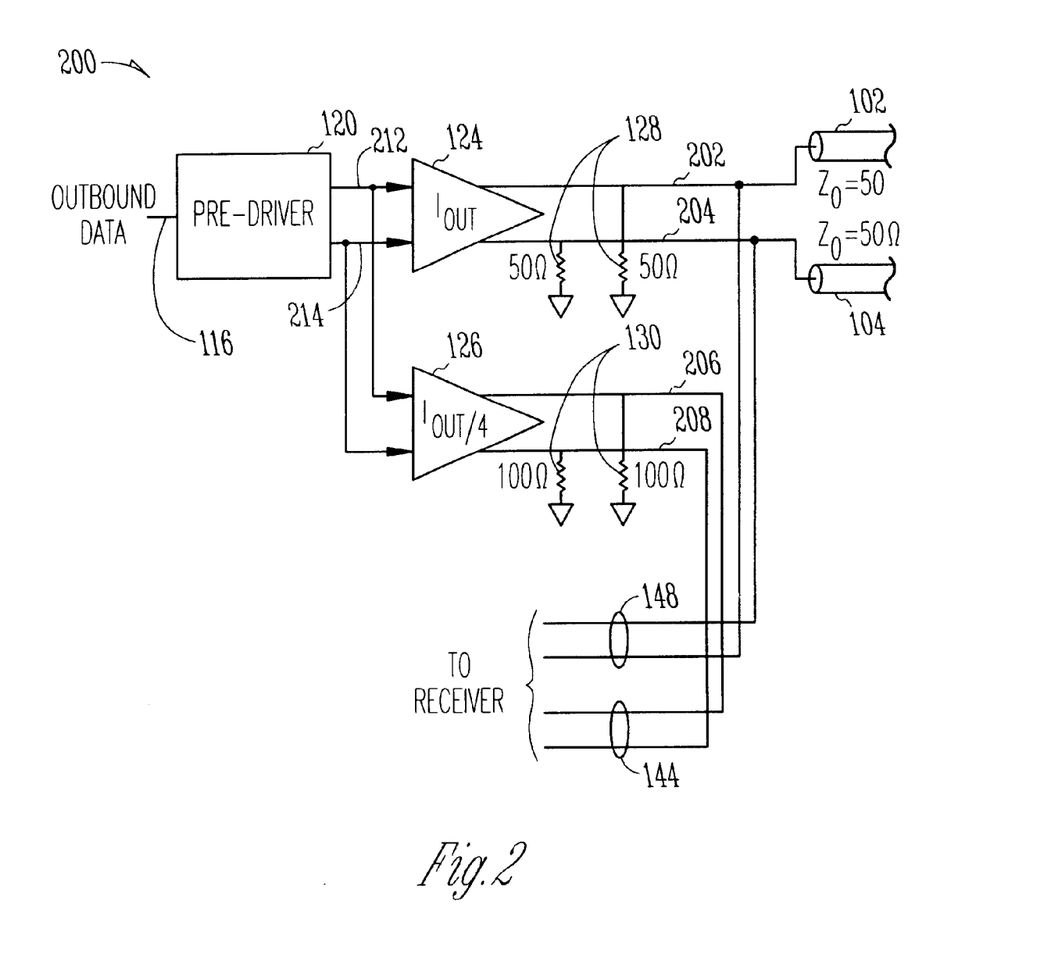
FIG. 2 shows components of a simultaneous bidirectional port circuit.

FIG. 2 shows components of a simultaneous bidirectional port circuit. Circuit 200 includes pre-driver 120, current mode output driver 124, current mode return driver 126, termination resistors 128 and 130, and conductors 102 and 104. Pre-driver 120 [receives] provides outbound data and pre-equalization data to drivers 124 and 126. Pre-driver 120 provides outbound data on node 212 and pre-equalization data on node 214. Example embodiments of pre-driver 120 are described more fully with reference to the figures that follow.

Driver 124 has an output current of $I_{out}$. All or a portion of $I_{out}$ is switched between bidirectional data lines 202 and 204 as the logical states change on nodes 212 and 214. In some embodiments, driver 126 is a scaled version of driver 124 that provides less current to save power. In the embodiment of FIG. 2, driver 126 is scaled by a factor of ¼, and has an output current of $I_{out}/4$. In other embodiments, the scale factor is other than ¼.

As explained above with reference to FIG. 1, termination resistors 128 and 130 on the outputs of drivers 124 and 126 can be modified to provide voltage scaling at the differential receiver. In the embodiment shown in FIG. 2, resistors 128 have a value of 50 ohms, and resistors 130 have a value of 100 ohms. The characteristic impedance of transmission line conductors 102 and 104 are 50 ohms. Driver 124 drives an impedance of 25 ohms, which is equivalent to resistor 128 (50 ohms) in parallel with a transmission line (50 ohms). Driver 126 drives an impedance equal to 100 ohms which is four times the impedance driven by driver 124. Because driver 126 drives one fourth the current into four times the impedance, the voltage developed by driver 126 is equivalent to the voltage developed by driver 124.

In the embodiments represented by FIG. 2, the return driver drives one fourth the current into four times the impedance. In other embodiments, factors other than four are used. For example, in one embodiment, driver 126 drives $I_{out}/8$ into 200 ohms. Many other current/impedance combinations are possible without departing from the scope of the present invention.

Figure 3:
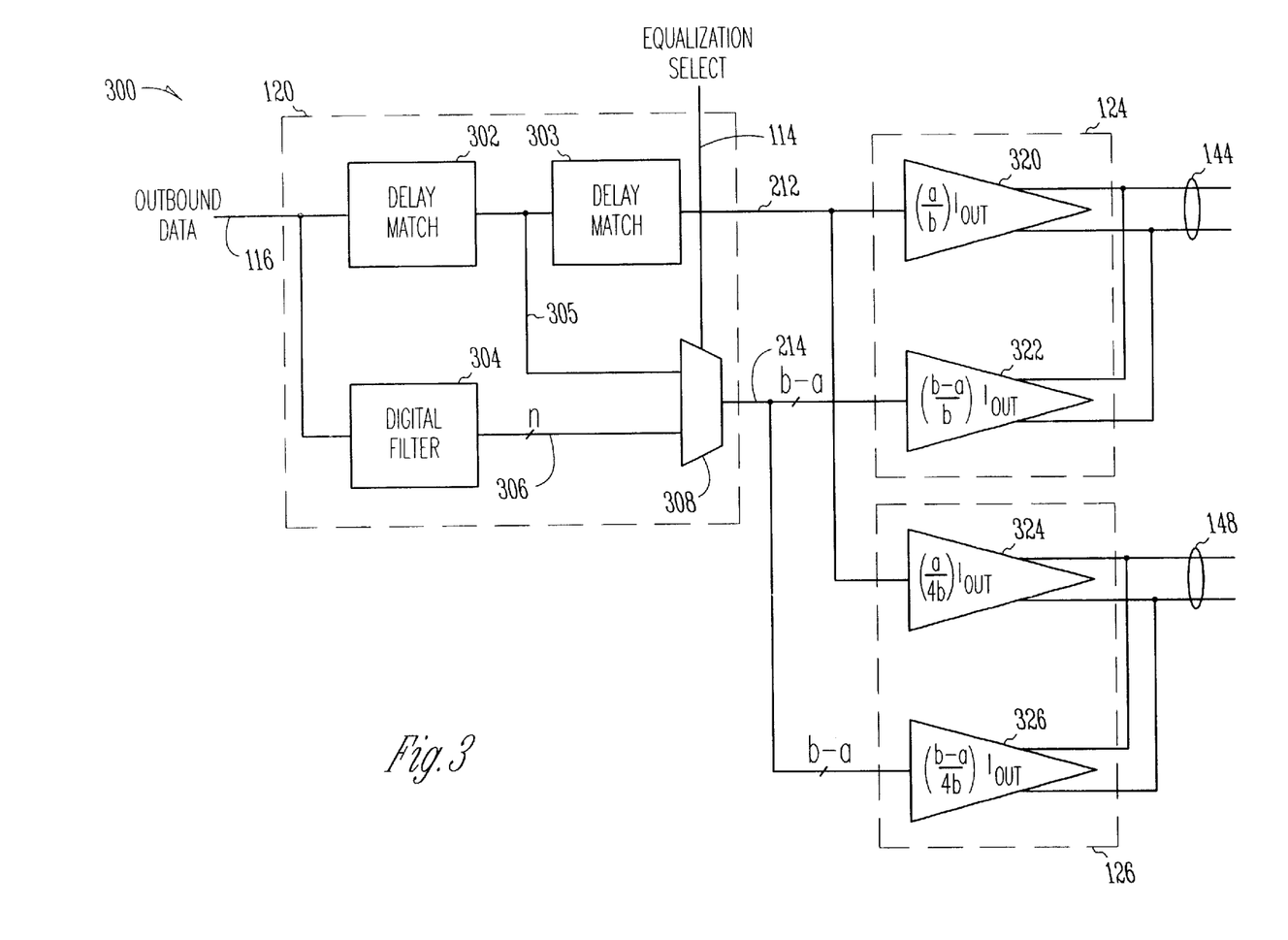
FIG. 3 shows a more detailed diagram of the components of FIG. 2.
Figure 4:
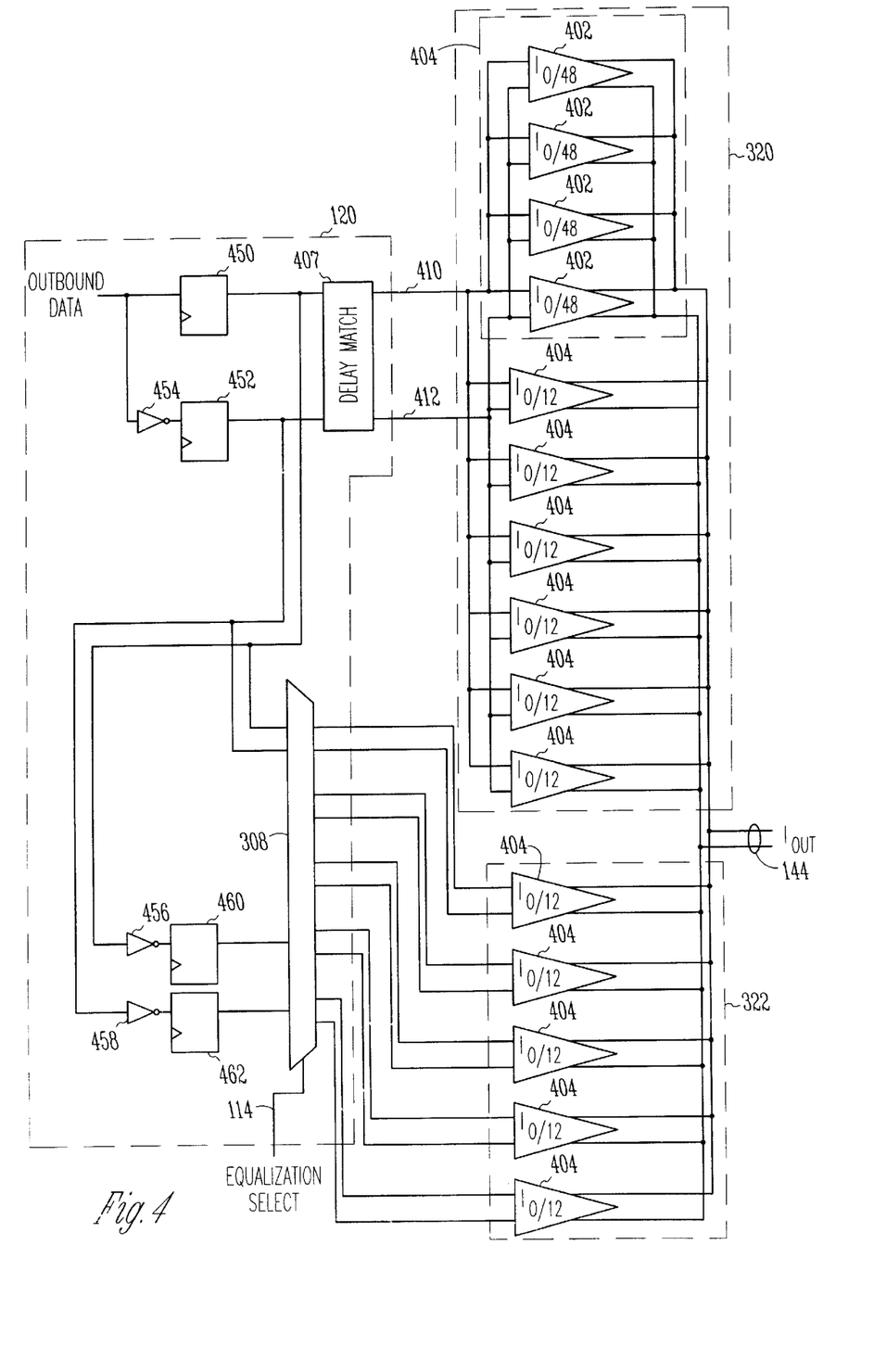
FIG. 4 shows a pre-driver circuit and a current mode output driver.

FIG. 3 shows a more detailed diagram of the components of FIG. 2. As shown in FIG. 3, pre-driver 120 includes delay match elements 302 and 303, digital filter 304, and multiplexor 308. Digital filter 304 and delay match element 302 receive outbound data on node 116. Digital filter 304 receives the outbound data and produces pre-equalization data on node 306. In different embodiments, digital filter 304 has a different number of filter taps, shown as "n" on node 306. In general, embodiments having more digital filter taps can equalize a greater number of frequencies. A digital filter embodiment with two taps is shown in FIG. 4. Delay match element 302 receives outbound data and delays it to match the delay of digital filter 304. Delay match element 303 receives the delayed outbound data on node 305 and delays it to match the delay of multiplexor 308.

Multiplexor 308 receives outbound data on node 305 and also receives pre-equalization data on node 306. Multiplexor 308 selects either outbound data or pre-equalization data to drive node 214. In some embodiments, node 214 is many physical nodes, and multiplexor 308 selects a variable number of output nodes as a function of equalization select data on node 114. For example, as shown in FIG. 3, node 214 includes a number of physical nodes equal to "b–a." Variable amounts of equalization are achieved by varying the equalization select data on node 114. For example, in embodiments in which "b–a" equals ten, multiplexor 308 can select any number of the ten nodes to drive pre-equalization data and any number to drive outbound data.

Current mode output driver 124 includes two separate drivers 320 and 322 having output current summed on the outputs. The total sum of output current is $I_{out}$. Driver 320 sources a fraction of $I_{out}$ equal to $(a/b)I_{out}$, and driver 322 sources a fraction equal to $((b-a)/b)I_{out}$. In some embodiments, these fractional currents are achieved by providing a total number of current drivers equal to "b" and dividing them into two groups; one having "a" drivers, and another having "b–a" drivers. One such embodiment is shown in FIG. 4. Driver 320 receives outbound data from pre-driver 120, and driver 322 receives a combination of outbound data and pre-equalization data on node 214. The output current of driver 320 provides $(a/b)I_{out}$ of output current as a result of the outbound data. The output current of driver 322 provides $((b-a)/b)I_{out}$ of current divided among outbound data and pre-equalization data. This allows a variable amount of equalization based on equalization select data on node 114.

Current mode return driver 126 also includes two separate drivers 324 and 326. The operation of drivers 324 and 326 is substantially the same as drivers 320 and 322, with the exception that the output currents are one fourth as great. This allows current mode return driver 126 to provide feedback data to differential receiver 140 (FIG. 1) without consuming as much current as driver 124.

FIG. 4 shows a pre-driver circuit and a current mode output driver. Pre-driver 120 includes inverters 454, 456, and 458, flip-flops 450, 452, 460, and 462, delay match element 407, and multiplexor 308. Flip-flops 450 and 452 form the delay match element 302 (FIG. 3), delay match element 407 corresponds to delay match element 303 (FIG. 3), and the combination of flip-flops 450, 452, 460, and 462, and inverters 456 and 458 form digital filter 304 (FIG. 3).

The digital filter of FIG. 4 is a two-tap digital filter, of which other embodiments exist within the scope of the present invention. Multiplexor 308 receives the delayed outbound data, and also receives the digital filter output. In the embodiments represented by FIG. 4, multiplexor 308 has differential inputs. In other embodiments, single-ended inputs are employed.

Figure 5:
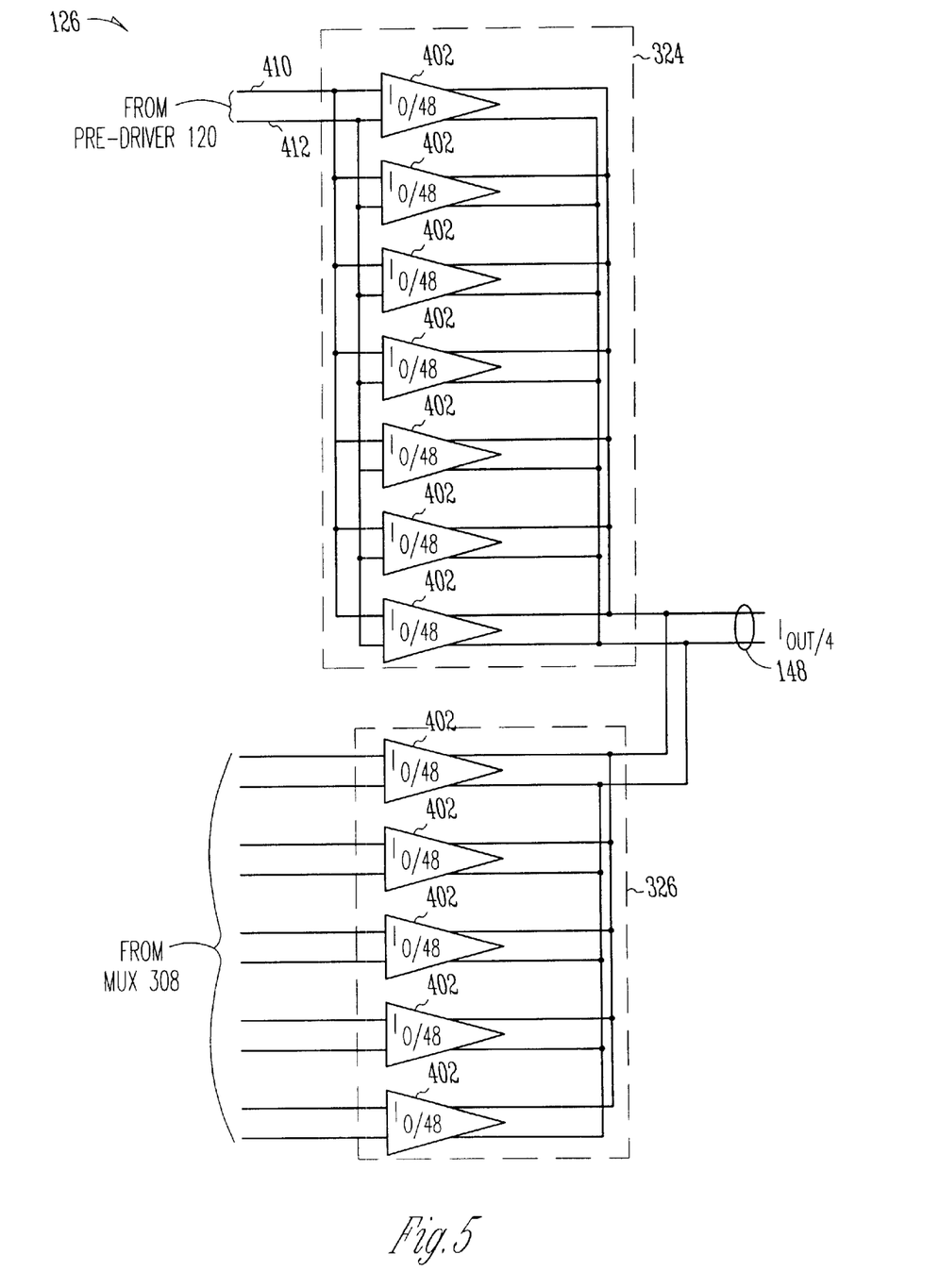
FIG. 5 shows a scaled current mode return driver.

Drivers 320 and 322 combine to form current mode output driver 124, and drive differential data lines 144. For clarity in presentation, current mode output driver 124 is shown in FIG. 4, and current mode return driver 126 is shown in FIG. 5. Driver 124 is divided up into 12 driver elements 404. This corresponds to a value of 12 for the variable "b" in FIG. 3. Seven of the 12 driver elements 404 are included in driver 320, and five of the 12 driver elements 404 are included in driver 322. This corresponds to a value of seven for the variable "a" in FIG. 3. Each driver element 404 drives $1/12$ of the total output current $I_{out}$.

The seven driver elements 404 of driver 320 always drive outbound data on differential data lines 144. The five driver elements 404 of driver 322, on the other hand, can drive either outbound data or pre-equalization data depending on the state of the equalization select data on node 114. Because multiplexor 308 can drive a variable number of driver elements 404 with pre-equalization data, variable pre-equalization can be achieved. In the embodiment of FIG. 4, six levels of pre-equalization can be provided by driving between zero and five driver segments 404 with pre-equalization data. The six levels provide 0 dB, 1.5 dB, 3.5 dB, 6 dB, 9.5 dB, and 16 dB of pre-equalization. In general, current mode output driver 124 can be divided into any number of driver segments 404 to provide any range and resolution of pre-equalization.

Each driver segment 404 includes four driver subsegments 402, as shown near the top of FIG. 4. Each subsegment 402 has an output current drive capability equal to ¼ the drive of each driver segment 404. This equates to $1/48\ I_{out}$. Each subsegment 402 is substantially identical to all others, such that each has substantially identical AC properties. This allows accurate current scaling by varying the number driver subsegments 402 within each driver segment 404, while scaling other circuit parasitics by the same factor. Scaling current output along with circuit parasitics is useful when a return driver is utilized along with the output driver to drive a differential receiver. A scaled embodiment of current mode return driver 126 is shown in FIG. 5.

FIG. 5 shows a scaled current mode return driver. Current mode return driver 126 includes drivers 324 and 326. Driver 324 includes seven driver subsegments 402, and driver 326 includes five driver subsegments 402. All seven driver subsegments in driver 324 are driven by pre-driver 120 with outbound data, and the five driver subsegments of driver 326 can be driven with either outbound data or pre-equalization data as a function of equalization select data. In the embodiments of FIGS. 4 and 5, current mode return driver 126 has ¼ the output current drive of current mode output driver 126.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A current mode driver circuit comprising:
a data input node and a data output node;
a first plurality of parallel driver segments coupled between the data input node and the data output node, to drive data on the data output node;
a pre-driver having an input node and an output node, the input node of the pre-driver coupled to the data input node; and
a second plurality of parallel driver segments coupled between the output node of the pre-driver and the data output node, to receive pre-equalization data and to drive the data output node.

2. The current mode driver circuit of claim 1 wherein each of the first and second plurality of parallel driver segments comprise four parallel current mode driver subsegments.

3. The current mode driver circuit of claim 1 wherein the pre-driver comprises a digital filter to form pre-equalization data from data on the data input node.

4. The current mode driver circuit of claim 3 wherein the digital filter comprises delay elements and inverters to create pre-equalization data from delayed and inverted data on the data input node.

5. A simultaneous bidirectional port circuit comprising:
a current mode output driver having an output node to drive a bidirectional data line;
a current mode return driver having an output node to provide data for comparison with inbound data on the bidirectional data line;
a differential receiver having input nodes coupled to the output node of the current mode output driver and the output node of the current mode return driver; and
a pre-driver that includes a data output node to provide outbound data to the current mode output driver and the current mode return driver, and an equalization data output node to provide pre-equalization data to the current mode output driver and the current mode return driver.

6. The simultaneous bidirectional port circuit of claim 5 wherein the pre-driver comprises a digital filter to produce the pre-equalization data on the equalization data output node.

7. The simultaneous bidirectional port circuit of claim 5 wherein the current mode output driver comprises:
a first plurality of parallel current mode driver segments responsive to the data output node of the pre-driver; and
a second plurality of parallel current mode driver segments responsive to the equalization data output node of the pre-driver.

8. A simultaneous bidirectional port circuit comprising:
a current mode output driver having an output node to drive a bidirectional data line;
a current mode return driver having an output node to provide data for comparison with inbound data on the bidirectional data line;
a differential receiver having input nodes coupled to the output node of the current mode output driver and the output node of the current mode return driver; and
a pre-driver that includes:
a data input node to receive outbound data;
a data output node to provide the outbound data to the current mode output driver and the current mode return driver;
a digital filter to create pre-equalization data from the outbound data;
a multiplexor to accept the outbound data and the pre-equalization data; and
an equalization data output node coupled to an output node of the multiplexor to conditionally provide pre-equalization data or outbound data to the current mode output driver and the current mode return driver.

9. The simultaneous bidirectional port circuit of claim 8 wherein the current mode output driver comprises:
a first plurality of parallel current mode driver segments responsive to the data output node of the pre-driver; and
a second plurality of parallel current mode driver segments responsive to the equalization data output node of the pre-driver.

10. The simultaneous bidirectional port circuit of claim 9 wherein each segment of the first and second plurality of parallel current mode driver segments comprises a plurality of parallel subsegments.

11. The simultaneous bidirectional port circuit of claim 10 wherein the current mode return driver comprises:
a third plurality of parallel current mode driver segments responsive to the data output node of the pre-driver; and
a fourth plurality of parallel current mode driver segments responsive to the equalization data output node of the pre-driver;
wherein the third plurality is equal in number to the first plurality, and the fourth plurality is equal in number to the second plurality.

12. The simultaneous bidirectional port circuit of claim 11 wherein each of the segments in the third and fourth pluralities include fewer subsegments than the first and second pluralities.

13. The simultaneous bidirectional port circuit of claim 11 wherein each segment in the first and second pluralities includes four parallel subsegments, and each segment in the third and fourth pluralities includes one subsegment.

14. The simultaneous bidirectional port circuit of claim 9 wherein:
the first plurality of parallel current mode driver segments includes seven segments; and
the second plurality of parallel current mode driver segments includes five segments.

15. An integrated circuit comprising:
a differential data node pair to couple to a pair of transmission lines external to the integrated circuit;
a plurality of differential current mode output driver segments configured in parallel and coupled to the differential data node pair to drive the pair of transmission lines;
a receiver having first and second differential input node pairs, the first differential input node pair coupled to the differential data node pair; and
a plurality of differential current mode return driver segments configured in parallel and coupled to the second differential input node pair of the receiver.

16. The integrated circuit of claim 15 wherein:
a first subset of the plurality of differential current mode output driver segments is operable to drive outbound data on the pair of transmission lines; and
a second subset of the plurality of differential current mode output driver segments is operable to drive either outbound data or pre-equalization data on the pair of transmission lines.

17. The integrated circuit of claim 16 further comprising a multiplexor to receive outbound data and pre-equalization data, and to drive the second subset of the plurality of differential current mode output driver segments.

18. The integrated circuit of claim 17 further comprising a pre-driver operable to receive outbound data and to drive the multiplexor with pre-equalization data.

19. The integrated circuit of claim 18 wherein the pre-driver comprises a digital filter to produce pre-equalization data from outbound data.

20. The integrated circuit of claim 16 wherein:

a first subset of the plurality of differential current mode return driver segments is operable to influence the second differential input node pair of the receiver with outbound data; and a second subset of the plurality of differential current mode return driver segments is operable to influence the second differential node pair of the receiver with either outbound data or pre-equalization data.

21. The integrated circuit of claim 15 wherein:

each of the plurality of differential current mode output driver segments comprises a plurality of parallel current mode driver subsegments; and each of the plurality of differential current mode return driver segments comprises fewer current mode driver subsegments than each of the plurality of differential current mode output driver segments.

22. An electronic system comprising:

a first integrated circuit having a simultaneous bidirectional port with a current mode driver coupled to a pair of conductors;

a second integrated circuit having a second simultaneous bidirectional port coupled to the pair of conductors, the second bidirectional port comprising:

a first plurality of current mode output drivers in parallel to drive outbound data on the pair of conductors; and a second plurality of current mode output drivers in parallel to drive either outbound data or pre-equalization data on the pair of conductors.

23. The electronic system of claim 22 wherein:

the first integrated circuit is coupled to a first voltage supply node operable to supply a first power supply voltage to the first integrated circuit; and the second integrated circuit is coupled to a second voltage supply node operable to supply a second power supply voltage to the second integrated circuit.

24. The electronic system of claim 22 wherein the second integrated circuit further comprises:

a third plurality of current mode return drivers to drive the outbound data back into the second integrated circuit; and a fourth plurality of current mode return drivers to drive either the outbound data or the pre-equalization data back into the second integrated circuit.

25. The electronic system of claim 24 wherein the second integrated circuit includes a digital filter to produce pre-equalization data from outbound data.

26. The electronic system of claim 24 wherein the third and fourth pluralities of current mode return drivers are configured to have less current drive than the first and second pluralities of current mode output drivers.

27. The electronic system of claim 26 wherein the first and second integrated circuits include a plurality of simultaneous bidirectional ports coupled together with transmission lines to form a simultaneous bidirectional interconnect bus between the first and second integrated circuits.

* * * * *

UNITED STATES PATENT AND TRADEMARK OFFICE
CERTIFICATE OF CORRECTION

PATENT NO. : 6,507,225 B2
DATED : January 14, 2003
INVENTOR(S) : Aaron K. Martin and Stephen R. Mooney It is certified that error appears in the above-identified patent and that said Letters Patent is hereby corrected as shown below:

Title page,
Item [56], References Cited, OTHER PUBLICATIONS, "Lee, S., et.," reference, insert -- ) -- after "(Aug. 1999)".
Item [74], *Attorney, Agent, or Firm*, insert -- , -- after "Kluth".

Column 1,
Line 40, delete "modem" before "integrated" and insert -- modern -- therefor.

Column 4,
Line 38, delete "[receives]" before "provides".

Signed and Sealed this

Twenty-seventh Day of July, 2004

JON W. DUDAS
*Acting Director of the United States Patent and Trademark Office*